(12) United States Patent
Peters (10) Patent No.: US 11,711,903 B1
(45) Date of Patent: Jul. 25, 2023

(54) SERVER RACK FLOOD SHROUD

(71) Applicant: Amazon Technologies, Inc., Seattle, WA (US)

(72) Inventor: Gordon C Peters, Tacoma, WA (US)

(73) Assignee: Amazon Technologies, Inc., Seattle, WA (US)

( * ) Notice: Subject to any disclaimer, the term of this patent is extended or adjusted under 35 U.S.C. 154(b) by 227 days.

(21) Appl. No.: 17/179,190

(22) Filed: Feb. 18, 2021

(51) Int. Cl.
*H05K 7/18* (2006.01)
*H05K 7/14* (2006.01)

(52) U.S. Cl.
CPC ............. *H05K 7/18* (2013.01); *H05K 7/1485* (2013.01)

(58) Field of Classification Search
None
See application file for complete search history.

(56) References Cited

U.S. PATENT DOCUMENTS

| 8,786,452 | B1* | 7/2014 | Kreitz | E04D 13/00 |
| | | | | 340/572.1 |
| 9,439,329 | B1* | 9/2016 | Towner | H05K 7/20745 |
| 2010/0230058 | A1* | 9/2010 | Mahoney | E04H 1/1238 |
| | | | | 160/331 |
| 2018/0295731 | A1* | 10/2018 | Burdoucci | H04M 1/00 |

FOREIGN PATENT DOCUMENTS

| CN | 111346321 | A | * | 6/2020 | |
| JP | 2013229729 | A | * | 11/2013 | G06F 1/182 |

* cited by examiner

*Primary Examiner* — James Wu
*Assistant Examiner* — Christopher L Augustin
(74) *Attorney, Agent, or Firm* — Kilpatrick Townsend & Stockton LLP (57) ABSTRACT

Systems and techniques for deploying a deployable water barrier to protect server racks and components housed thereon are provided. The deployable water barrier is deployed in response to water detected at the server rack. The deployable water barrier is deployed by a barrier deployment mechanism, causing the barrier to expand and cover a front and/or a back side of the server rack.

19 Claims, 7 Drawing Sheets

SERVER RACK FLOOD SHROUD

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

From time to time, computing resources in data centers encounter adverse environmental conditions, such as earthquakes, floods, and fire. Water presence due to a sprinkler system (e.g., in response to a fire) or due to a roof or pipe failure may cause substantial damage to rack computing systems.

Some data centers include sprinkler systems to contain damage from fire in a computing room. In many data centers, the sprinkler system for a computing room includes piping and sprinkler heads that are located in, or suspended from, the ceiling of the computing room. In some cases, these sprinkler systems distribute water beyond the area in which a fire is located. In such cases, some of the equipment lost in the event may be due to the water applied to areas beyond the location of the fire, rather than the fire itself.

BRIEF DESCRIPTION OF THE DRAWINGS

Various embodiments in accordance with the present disclosure will be described with reference to the drawings, in which.

DETAILED DESCRIPTION

Embodiments and techniques described herein are directed to deploying a deployable water barrier to shield a server rack from water and prevent damage to the electronic components housed therein. Some data centers include rows of server racks in rooms. The server racks may be racks or cabinets that house datacenter electronic components such as servers. Data centers may include fire suppression systems that dispense water or other suppressant in response to detecting a fire. In some examples, water or liquid may cascade down onto server racks from above due to a water pipe failure, a roof failure, a coolant line failure, or other such incidents. The embodiments and techniques described herein provide for detecting water and deploying a deployable barrier to shield the server rack from water. The deployable barrier may be stored in a stowed configuration and expand to a deployed configuration in response to detecting the water.

In some examples, the deployable barrier may include an inflatable air bag that deploys as air or gas is pumped or released into the inflatable air bag. The deployable barrier is formed of a water resistant or water impervious layer and the air bag may be air tight to retain the air or gas and maintain the barrier in the deployed configuration. The deployable barrier may be filled from a gas canister, for example containing carbon dioxide or pressurized air, or from a pump system that pumps gas into the deployable barrier. The deployable barrier may be stowed at a top end of the server rack and deploy down along the height of the server rack. The server rack may also include a baffle at the top end that diverts water towards at least one of a front side or a back side of the server rack, where deployable water barriers are positioned.

Techniques described herein also enable a power disconnect switch or interruption element to disconnect or interrupt power delivered to servers or other datacenter electronic components housed within the server racks. The interruption element is controlled by a control system that also causes the deployable water barrier to deploy. For example, in operation, a sensor system detects water incident on or near the server rack, such as with a water sensor deployed on a top end of the server rack. In response to detecting the water incident on the server rack, the controller causes the deployable water barrier to deploy, for example by filling an inflatable portion of the deployable water barrier to expand the deployable water barrier along the height of the server rack. Additionally, in response to detecting the water, the controller may cause power delivered to the server rack or distributed through a power shelf of the server rack to be interrupted, for example by a power interruption element or through the use of a power shelf controller.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
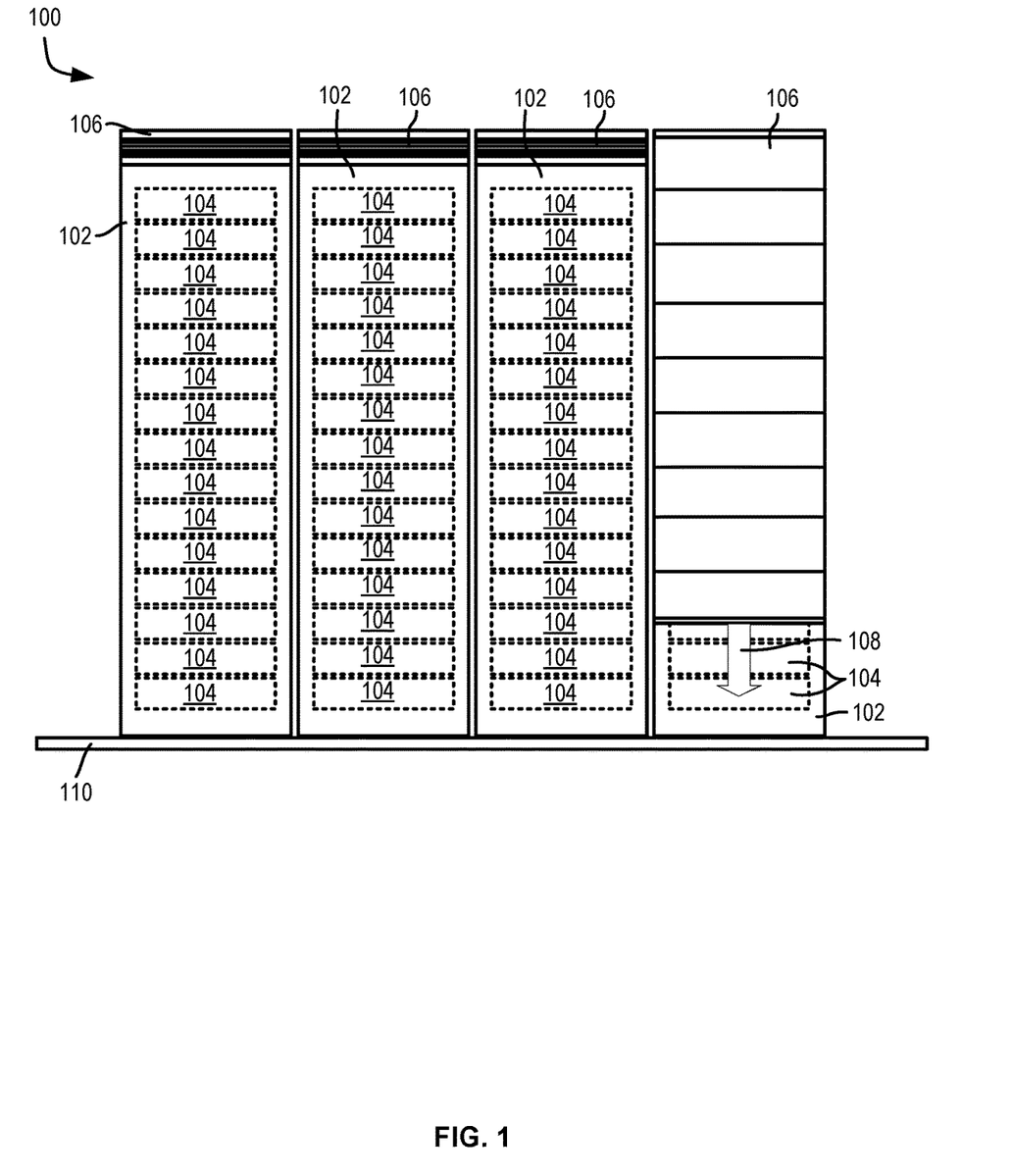
FIG. 1 illustrates server racks having deployable water barriers, according to at least one example.

FIG. 1 illustrates a system 100 with server racks 102 having deployable water barriers 106, according to at least one example. The server racks 102 are arranged in a row resting on a horizontal surface 110, with adjacent server racks positioned side by side such that a front side and a back side of each server rack 102 is exposed, for access to datacenter components 104, such as servers. Each of the server racks 102 are equipped with deployable water barriers 106 that deploy to prevent ingress of water into the server racks 102.

The server racks 102 are each designed to accommodate datacenter components 104. The server rack 102 may be designed to accept datacenter components 104 at varying locations, heights, and/or of varying sizes. In the example shown in FIG. 1, the datacenter components 104 are shown having the same size, though in some examples other and different sizes of datacenter components are envisioned. For instance, a datacenter component 104 located within the server rack 102 is of a first height, which may be sized according to a rack unit (U) size system to be any size, such as ½ U and/or 1 U. Additional datacenter components 104 may be of the same height or U as the datacenter component 104 or may be of a different size. Other datacenter components (not shown) may be installed in the server rack 102. The datacenter components 104, may be distributed at any height along the server rack 102. The datacenter components 104 may be, for example, servers, JBODs, network switches, automatic transfer switches (ATSes), power distribution units (PDUs), or any other electronic equipment that is mountable in a server rack 102.

The deployable water barrier 106 is shown in both a stowed and a deployed configuration in FIG. 1. The deployable water barrier 106 may be stowed at a top end of the server racks 102 and deploy along the height of the server rack 102. In some examples the deployable water barrier 106 may be stowed at a bottom end or middle of the server rack 102 and deploy along the height of the server rack 102 to cover a front end and/or a back end of the server rack 102. As shown in FIG. 1, the deployable water barrier 106 extends from the top end of the server rack 102 in direction 108 to cover the exposed end of the server rack 102 and protect the datacenter components 104 stored therein from water or other liquids incident on the server rack 102, for example from a fire suppression system, due to a burst pipe, roof failure, or other such incident.

Figure 2:
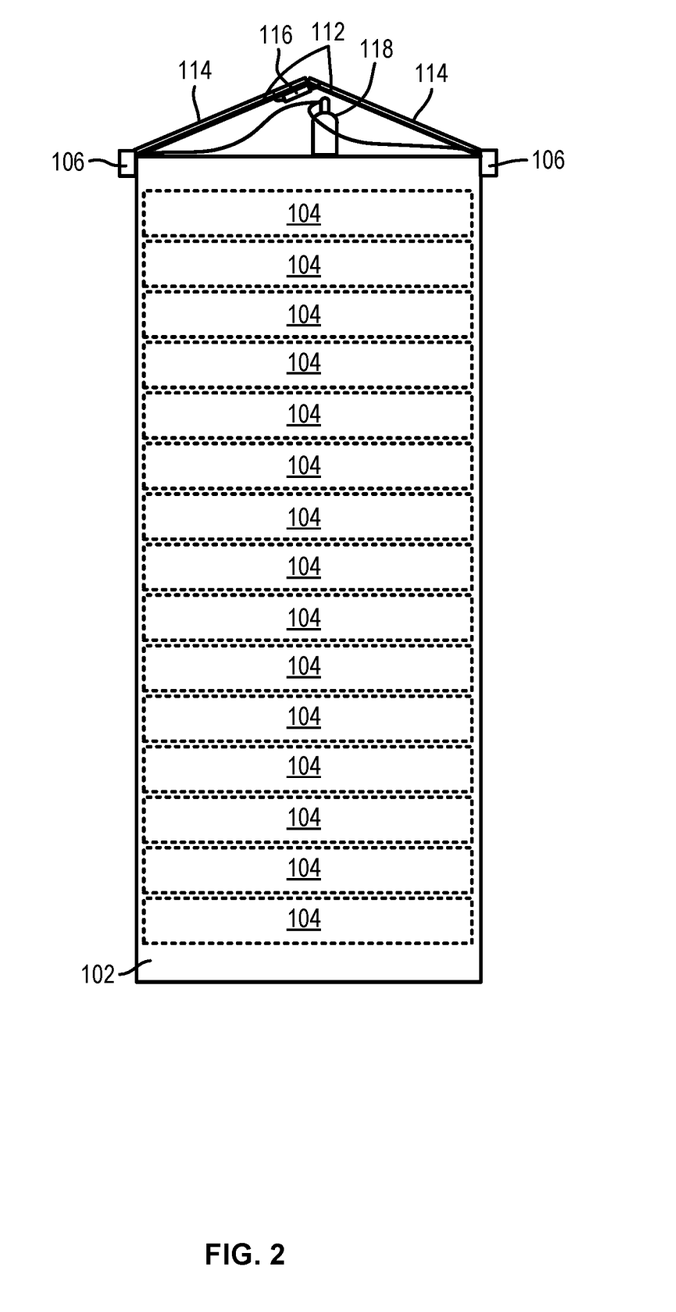
FIG. 2 illustrates an example of a server rack having deployable water barriers, according to at least one example.

FIG. 2 illustrates an example of a side view of a server rack 102 having deployable water barriers 106, according to at least one example. The server rack 102 may be the same as the server rack 102 of FIG. 1, and may include server racks, cabinets, and other such housings for electronic components. The server rack 102 includes a baffle 112, water sensor 114, controller 116, and gas supply system 118 in addition to the deployable water barriers 106.

The baffle 112 directs water incident on the top end of the server rack towards at least one of the front side or the back side of the server rack 102. The baffle 112 is sloped such that water will not sit stationary on top of the server rack 102 and also provides a space for storing components for the deployable water barriers 106, such as the gas supply system 118 that inflates the deployable water barriers 106 and the controller 116. The baffle 112 includes a sensor 114 on the top surface that detects water or other liquids incident on the server rack 102. The sensor 114 may be a water detection sensor, a conductive sensor, a capacitive sensor, or other such sensor.

In some examples, the sensor 114 may include other devices, such as a collection device and one or more sensors to detect an amount of water in contact with and/or near the server rack 102. For example, the sensor 114 may include a collection basin with one or more sensors to determine a weight and/or volume of liquid gathered in the basin. The sensor 114 may communicate a signal in response to the weight and/or volume of liquid in the basin exceeding a threshold of weight and/or volume of liquid. By collecting a quantity of water before triggering the deployable barrier 106, the sensor 114 may not trigger in response to false positives, such as a single droplet of water or a sensor error.

The deployable water barriers 106 are positioned at a top end of the server rack 102. The deployable water barriers 106 may be rolled or otherwise compressed in a stowed configuration when not in use. The deployable water barriers 106 may include an airbag that fills with gas to expand and deploy the deployable water barrier 106, causing it to extend along the height of the server rack 102. The deployable water barrier 106 may be formed of a plastic or rubber material, or any other flexible and/or compressible material such as thin (e.g., less than 1 mm) sheets of polypropylene on a front and a back side of the deployable water barrier 106 that enclose a volume fillable with gas from the gas supply system 118. The deployable water barrier 106 is formed of a material that is air tight such that the gas used to fill the airbag is retained and maintains the airbag in an inflated configuration when deployed. The deployable water barrier 106 is water and/or chemical resistant to resist ingress of water and/or chemicals into the server rack 102.

In some examples, the deployable water barriers 106 may include other structures and/or devices than the airbag. For instance, a system of louvers may rotate, slide vertically, slide horizontally, or otherwise re-position to block access into the server rack 102. In some examples, perforations in a door of a server rack 102 may be covered by re-positioning a sliding panel vertically or horizontally to close the perforations. Such panels, louvers, and physical barriers may be re-positioned by linear actuators, hydraulics, or other re-positioning devices. Guides, such as guides 128 as described with respect to FIG. 4 may guide the re-positioning of louvers, panels, and other structures to block ingress of water into the server rack 102.

The gas supply system 118 includes a gas canister, gas reservoir, or pump system to provide gas to fill the deployable water barriers 106 and cause the deployable water barriers 106 to expand as they fill with gas and cover the front side and the back side of the server rack 102. In some examples, the deployable water barrier 106 includes an integral airbag, or series of air compartments that, when filled with gas from the gas supply system 118, cause the deployable water barrier 106 to expand and extend down the height of the server rack 102. The gas supply system 118 may include a canister of a pressurized gas, such as carbon dioxide. The pressurized gas may be a non-flammable gas for safety in the event of a fire. The gas supply system 118 may also include a gas pump that pumps air from the surrounding environment into the deployable water barriers 106.

The gas supply system 106 may be controlled by the controller 116 in response to detecting water incident on the sensor 114. The controller 116 may include a processor and a memory, and may be an example of a computing device of FIG. 7. The controller 116 is operably coupled with the sensor 114 such that when water is detected at the sensor 114, the controller 116 receives a signal from the sensor 114 and causes one or more other systems to perform actions. The controller 116 may, for example, cause the gas pump to pump air into the deployable water barriers 106. The controller 116 may, in other examples, actuate a valve of a gas canister to release pressurized carbon dioxide, or other gases, into the deployable water barriers 106.

In some examples, the controller 116 may be operably coupled with a building system, such as a building notification system, maintenance system, or emergency system. In the event of a fire alarm or detection of a fire, the deployable water barriers 106 may be deployed, as caused by controller 116, to prevent damage to the server rack 102 and the datacenter components 104 due to spraying of fire suppression, such as fire sprinklers. The controller 116 may also communicate with the building system to provide a notification in the event of deployment of the deployable water barrier 106, for example to notify a central maintenance system of potential water spill in the building. In some examples, the controller 116 may be configured to receive a command from a central maintenance or emergency system and deploy the deployable water barrier 106 in response to the signal, such as an override signal. In some examples the deployable water barrier 106 may be deployed in response to only one or one or more of signals from the sensor 114, a signal from a fire suppression system, and/or a signal from a building-wide system.

Figure 3A:
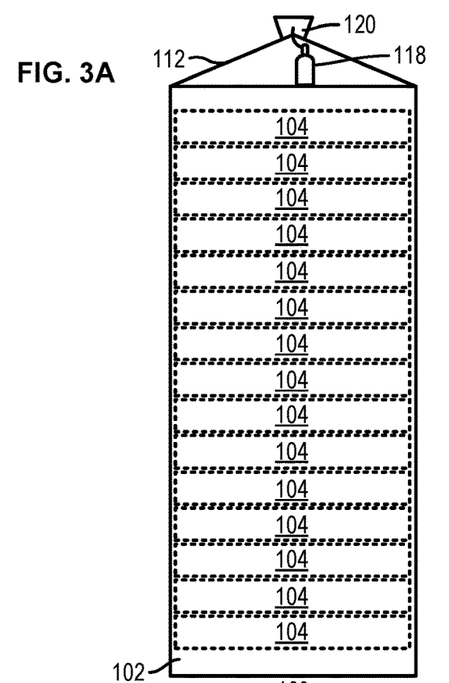
FIG. 3A-C illustrate stages of deployment of a deployable water barrier on a server rack, according to at least one example.
Figure 3B:
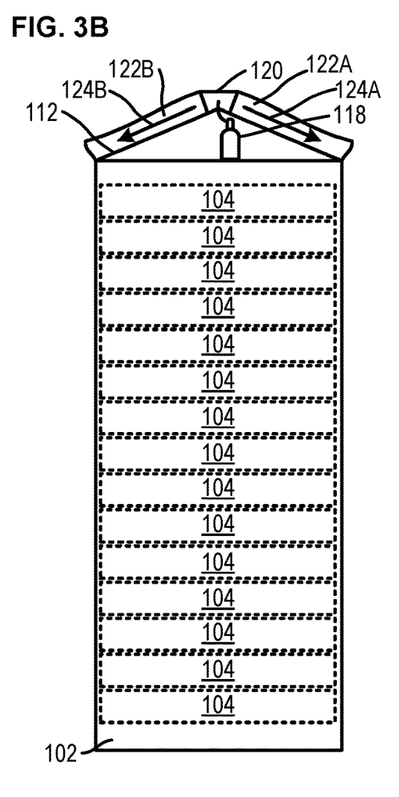
Figure 3C:
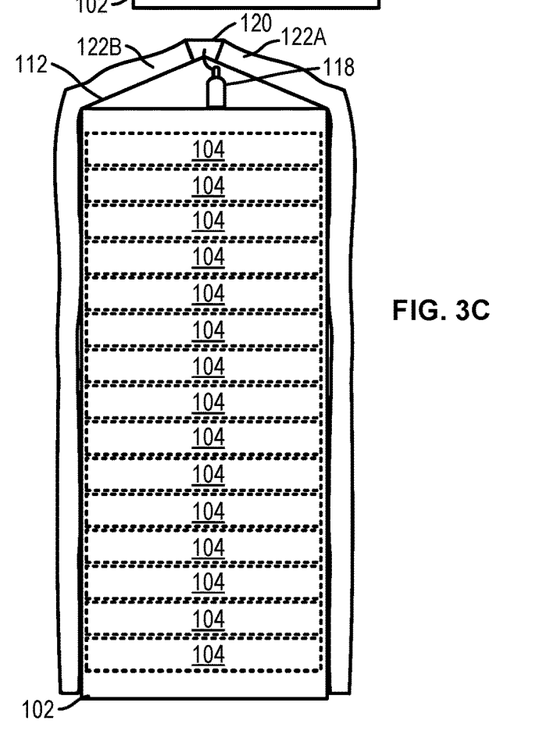

FIG. 3A-C are side views that illustrate stages of deployment of a deployable water barrier 120 on a server rack 102, according to at least one example. As illustrated, the server rack 102 includes a deployable water barrier 120 that extends in two directions, to cover a front and a back side of the server rack 102, though in some examples the deployable water barrier may be implemented in separate deployable water barriers, such as deployable water barriers 106 of FIGS. 1 and 2. The server rack 102 includes datacenter components 104, baffle 112, and gas supply system 118 as described above with respect to FIGS. 1 and 2. The server rack may also include a sensor 114, controller 116, and other elements of other embodiments described herein. In FIG. 3A, the deployable water barrier 120 is stowed in a stowed configuration, which may include a rolled up deployable water barrier, a compressed deployable water barrier, and/or a folded deployable water barrier. The deployable water barrier 120 of FIG. 3 deploys and the deployed air bags 122A and 122B extend in first and second directions 124A and 124B along the baffle 112 to the front side and the back side of the server rack 102, as shown in FIG. 3B. The air bags 122A and 122B then extend along the height of the server rack 102 to the bottom end of the server rack 102, as shown in FIG. 3C. The air bags 122A and 122B may be molded such that the air bags 122A and 122B have a profile in the deployed configuration that enables the air bags 122A and 122B to remain adjacent and/or in contact with the server rack 102. In some examples the air bags 122A and 122B may include a weighted end at the distal end of the air bags 122A and 122B such that the weighted end causes the air bags 122A and 122B to descend vertically once the air bags 122A and 122B have extended past the edges of the top end of the server rack 102. The weighted end may also enable the air bags 122A and 122B to remain in close proximity to the front side and the back side of the server rack 102 and not be disturbed or blown out of position by air or other forces.

Figure 4:
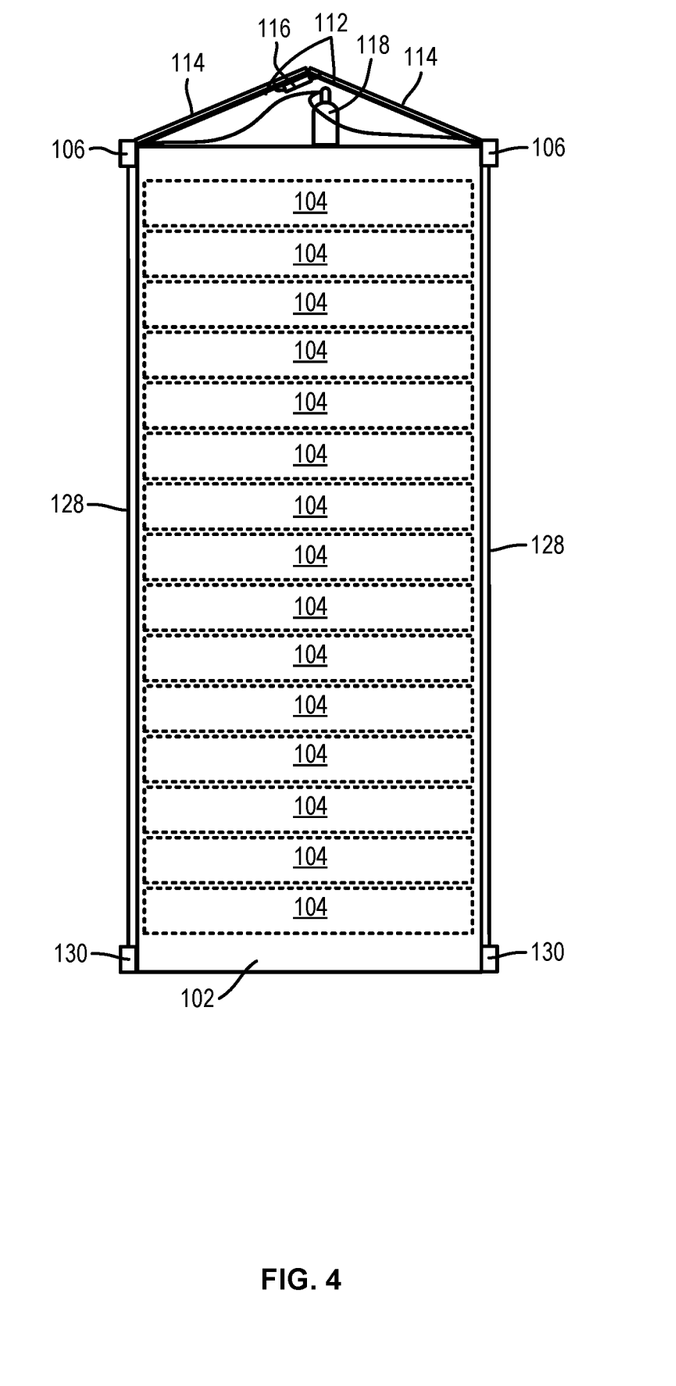
FIG. 4 illustrates an example of a server rack having deployable water barriers and guide elements, according to at least one example.

FIG. 4 is a side view that illustrates an example of a server rack 102 having deployable water barriers 106 and guide elements 128, according to at least one example. The server rack 102 and the deployable water barriers 106 may be the same as described above with respect to FIGS. 1 and 2. In the example shown in FIG. 4, the deployable water barriers 106 may extend along the height of the server rack 102 by following guide elements 128 as the deployable water barriers 106 expand. The guides 128 may include rails coupled to the edges of the deployable water barriers 106. The guides 128 may also include other guide elements that rest on either side of the front and/or back side of the server rack 102 and guide each edge of the deployable water barriers 106 and, similar to the weight elements described with respect to FIG. 3, prevent the deployable water barriers from moving away from the front side and/or the back side of the server rack 102. The guides 128 affix to the server rack at the top end at the deployable water barrier 106 and at the bottom with bracket 130. In some examples, the guides 128 may be used in conjunction with a linear actuator to drive the deployable water barriers 106 vertically along the height of the server rack 102. The linear actuators may include any number of linear actuation devices included spring driven elements, linear motion devices, and the like, especially for use with systems of louvers and/or panels that are repositioned to block ingress into the server rack 102. In some examples, the deployable water barrier 106 may be filled and/or driven through a chemical reaction, such as by enabling contact between chemicals that release gas or expand, such as by forming an expanding foam.

Figure 5A:
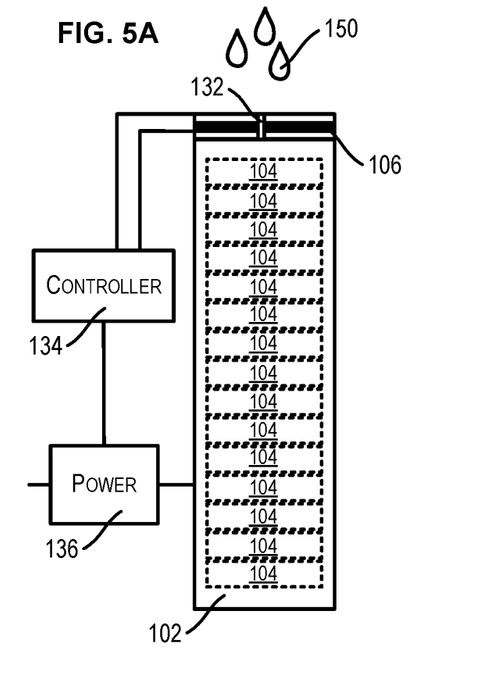
FIG. 5A-D illustrate stages of deployment of a deployable water barrier on a server rack including a power interruption element, according to at least one example.

FIG. 5A-D are front or rear views that illustrate stages of deployment of a deployable water barrier 106 on a server rack 102 including a power interruption element, according to at least one example. The server rack 102 may be the server rack 102 of FIGS. 1 and 2 and include the elements described with respect thereto. In FIG. 5A, water 150 contacts a sensor, such as sensor 114, and the sensor conveys a signal to controller 134. The controller 134 may include controller 116 and may also include a power interruption element for communicating with a power system 136 and interrupting a power supply to the server rack 102, for example through the power shelf controller of the server rack 102. The deployable water barrier 106 may be retained with retainer 132 in the stowed configuration. The retainer 132 may be a clip that is released as the deployable water barrier 106 expands when it is filled with gas. The retainer 132 may include a releasable element, such as hook and loop fasteners, clips, or other releasable connections.

Figure 5B:
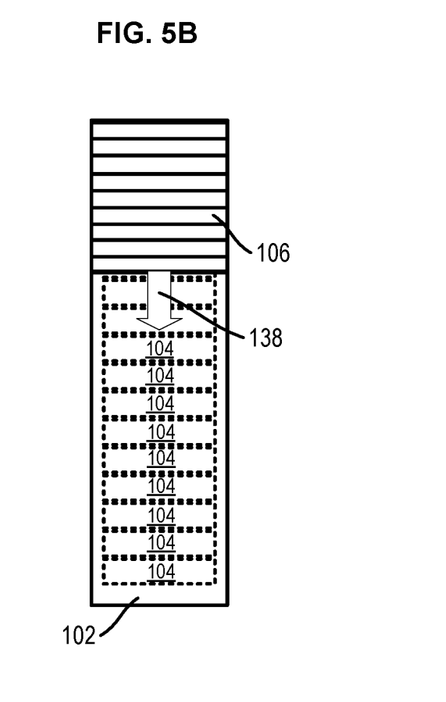
Figure 5C:
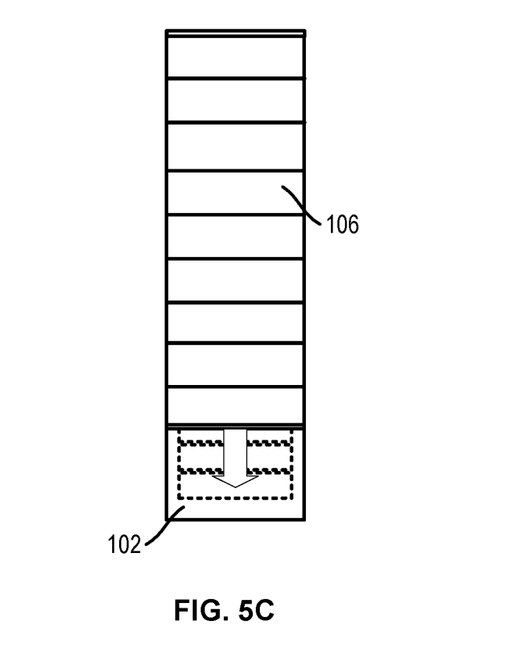
Figure 5D:
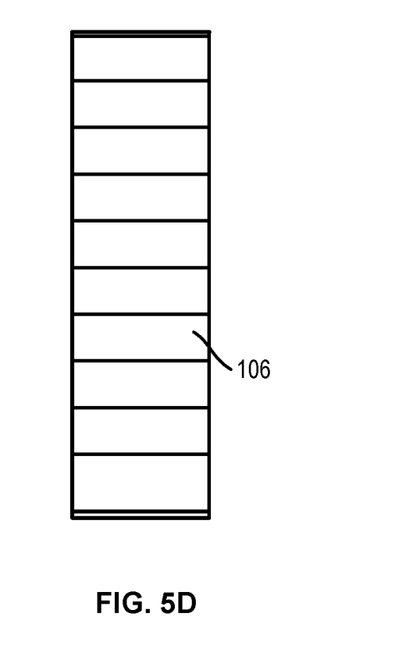

In FIG. 5B, after the controller 134 conveys a signal to cause the gas system 118 to fill the deployable water barrier 106, the deployable water barrier 106 begins to fill and expands, covering the front of the server rack 102 and expanding in direction 138. The deployable water barrier 106 expands further in direction 138 until the deployable water barrier 106 reaches the bottom end of the server rack 102, as depicted in FIGS. 5C and 5D.

Figure 6:
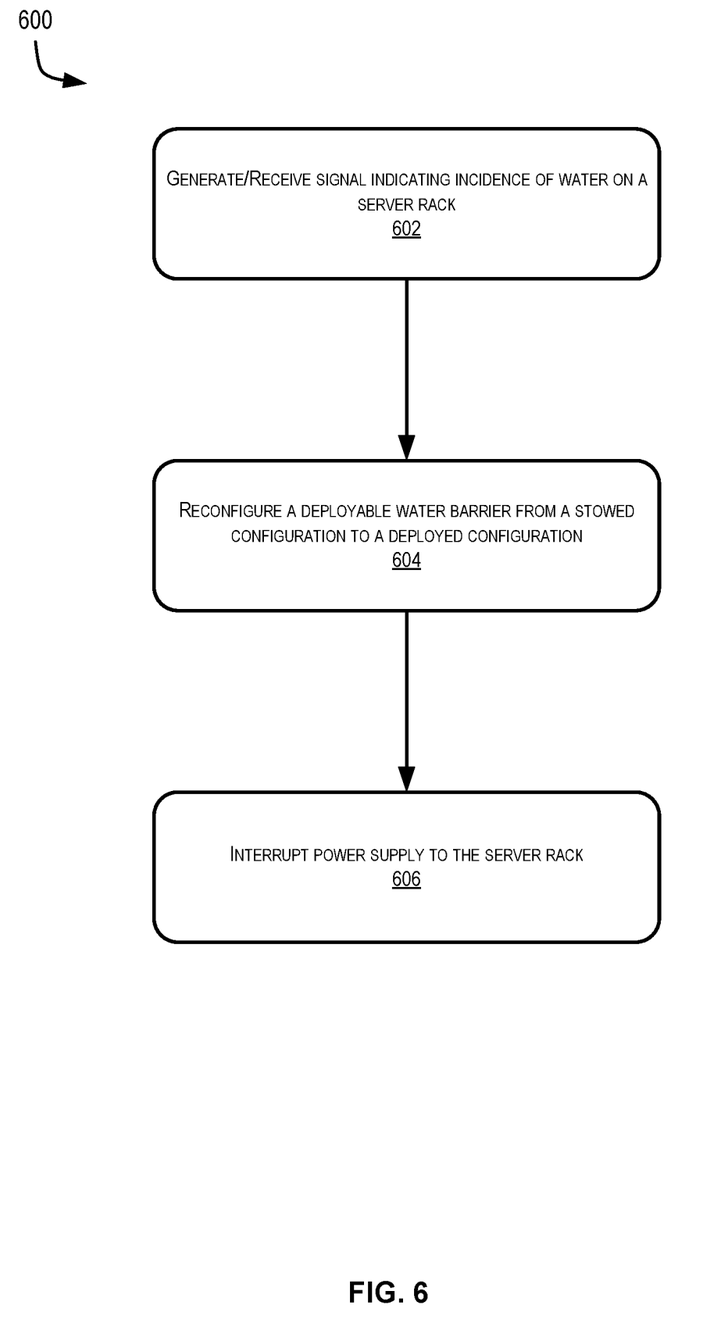
FIG. 6 illustrates an example process for deploying a water barrier on a server rack, according to at least one example.

FIG. 6 illustrates an example process 600 for deploying a water barrier on a server rack, according to at least one example. The process 600 may be performed using the systems described herein, including the deployable water barrier 106 and the controller 116 and/or 134. Some or all of the process 600 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware, or combinations thereof. The code may be stored on a computer-readable storage medium, for example, in the form of a computer program comprising instructions executable by one or more processors. The computer-readable storage medium may be non-transitory. The controller 134 may comprise the non-transitory memory and the processor. In some examples, the actions described with respect to FIG. 6 may be performed at a central computing system of a building, such as a cloud computing system in addition to or in alternative with the local controller 116.

At 602, the process 600 includes generating and/or receiving a signal indicative of incidence of water on or near a server rack 102. The sensor 114 may detect the incidence of water and convey a signal indicating the presence of water to a controller, such as controller 134 and/or controller 116. In some examples, the incidence of water may also be determined based additionally or alternatively on control signals, for example from a building maintenance system detecting a pipe or roof failure.

In some examples, at 602, the process 600 may include receiving an activation signal from a fire suppression system. The signal may be received at the controller 134 and/or 116 and may indicate either that a fire suppression system is activated in proximity to the server rack 102 or that a fire suppression system is about to activate, such that the controller 134 and/or 116 may cause the deployable water barrier 106 to deploy before the fire suppression system soaks the server rack 102. The activation signal may be received in response to a determination by a fire suppression system that water and/or fire suppressant will imminently be dispersed in the proximity of the server rack 102 to avoid deployment when a fire detection system is triggered by a false positive.

In some examples, at 602, a series of steps may be performed before deploying the deployable water barrier 106. For example, in some examples a first signal may be received indicating a presence of water in the region of the server rack 102 but the deployable water barrier 106 may not be deployed until a second signal is received indicating a threshold amount of water is in contact with and/or near the server rack 102.

At 604, the process 600 includes reconfiguring a deployable water barrier from a stowed configuration to a deployed configuration. As described herein, various examples include deploying an air bag by filling the air bag from a gas reservoir of a pressurized gas and/or from a gas pump. In some examples a mechanical and/or chemical actuator may likewise be used to drive the deployment of the deployable water barrier 106.

At 606, the process 600 includes interrupting a power supply to the server rack 102. The power supply may be interrupted by a power interruption element incorporated at a power shelf of the server rack 102, such that power supplied to the server rack 102 is disrupted. In addition to preventing damage to the datacenter components 104, shutting off the power to the server rack shuts down cooling fans or other such elements that may blow into the deployable water barrier 106 and displace the deployable water barrier 106 from the front side or back side of the server rack 102, causing a gap that may enable ingress of water into the server rack 102. In some cases, the power supply is interrupted before the water barrier is partially or completely deployed.

Figure 7:
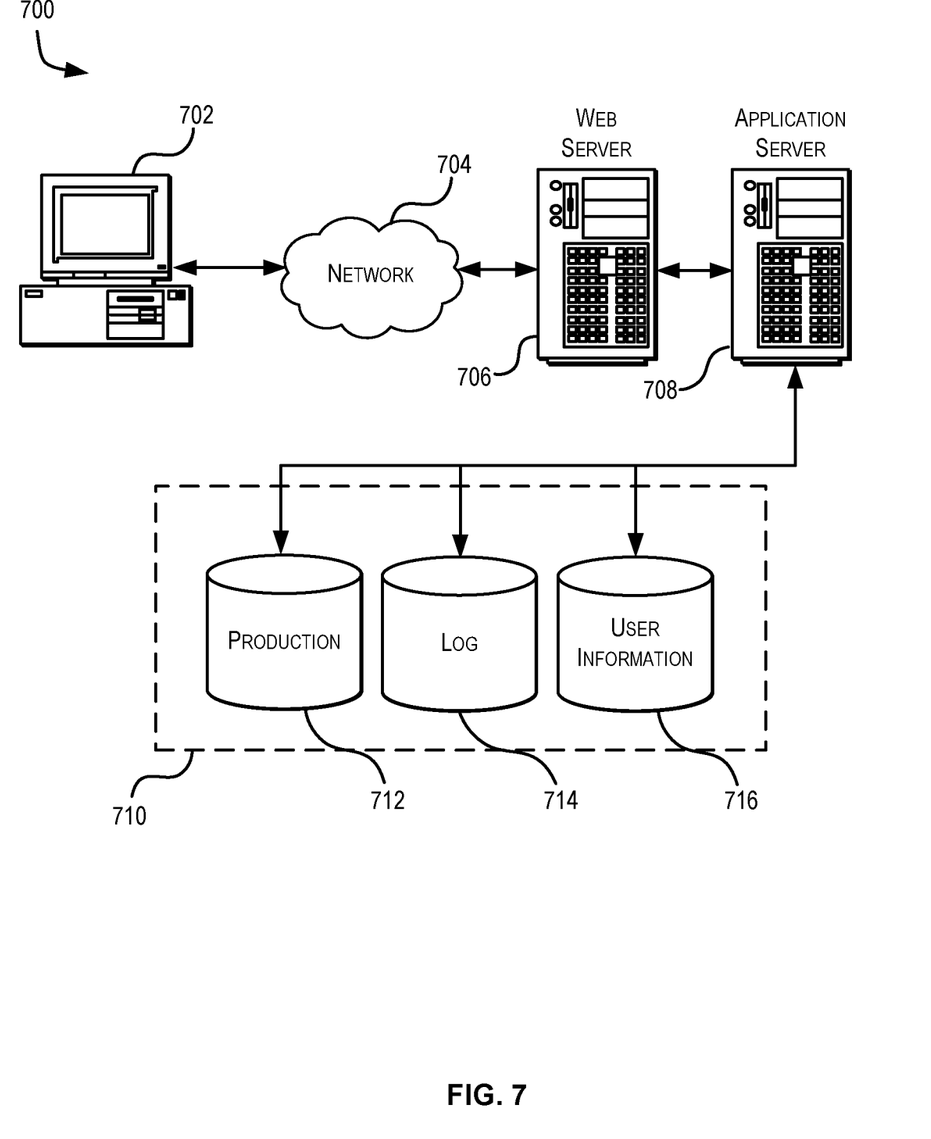
FIG. 7 illustrates an environment in which various embodiments can be implemented.

FIG. 7 illustrates aspects of an example environment 700 for implementing various embodiments. In some examples, control of deployment of deployable water barrier 106 may be managed through a web-based environment, a remote computing device, a network device, or other such device or system. As will be appreciated, although a Web-based environment is used for purposes of explanation, different environments may be used, as appropriate, to implement various embodiments. The environment includes an electronic client device 702, which can include any appropriate device operable to send and receive requests, messages, or information over an appropriate network 704 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 706 for receiving requests and serving content in response thereto, although for other networks an alternative device serving a similar purpose could be used as would be apparent to one of ordinary skill in the art.

The illustrative environment includes at least one application server 708 and a data store 710. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application. The handling of all requests and responses, as well as the delivery of content between the client device 702 and the application server 708, can be handled by the Web server. It should be understood that the Web and application servers are not required and are merely example components, as structured code discussed herein can be executed on any appropriate device or host machine as discussed elsewhere herein.

The data store 710 can include several separate data tables, databases or other data storage mechanisms and media for storing data relating to a particular aspect. For example, the data store illustrated includes mechanisms for storing production data 712 and user information 716, which can be used to serve content for the production side. The data store also is shown to include a mechanism for storing log data 714, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 710. The data store 710 is operable, through logic associated therewith, to receive instructions from the application server 708 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 702. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 7. Thus, the depiction of the system 700 in FIG. 7 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other applications for purposes such as development and database management. These devices also can include other electronic devices, such as dummy terminals, thin-clients, gaming systems, and other devices capable of communicating via a network.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An apparatus for protecting datacenter electronic components from water damage, the apparatus comprising:
   a server rack comprising a baffle configured to direct water incident on a top end of the server rack towards a front side of the server rack and a back side of the server rack;
   datacenter electronic components mounted in the server rack;
   a gas supply;
   a front-side deployable water barrier attached to a top end of the server rack and having a stowed configuration and a deployed configuration, wherein the front-side deployable water barrier reconfigures from the stowed configuration to the deployed configuration when filled with gas from the gas supply to extend exterior to and along a front side of the server rack from the top end of the server rack to a bottom end of the server rack to block water ingress into the server rack through the front side of the server rack;
   a back-side deployable water barrier attached to the top end of the server rack and having a stowed configuration and a deployed configuration, wherein the back-side deployable water barrier reconfigures from the stowed configuration to the deployed configuration when filled with gas from the gas supply to extend exterior to and along a back side of the server rack from the top end of the server rack to the bottom end of the server rack to block water ingress into the server rack through the back side of the server rack;
   a sensor configured to detect occurrence of water incident on the server rack; and
   a controller coupled with the sensor and the gas supply, wherein the controller is configured to cause the gas supply to supply the gas to each of the front-side deployable water barrier and the back-side deployable water barrier in response to the sensor detecting occurrence of water incident on the server rack.

2. The apparatus of claim 1, wherein the controller is further configured to cause the gas supply to supply the gas in response to a signal from a building sprinkler system.

3. The apparatus of claim 1, wherein the controller is operatively coupled with a power source of the server rack and the controller is further configured to interrupt power supplied to the server rack in response to the sensor detecting occurrence of water incident on the server rack.

4. The apparatus of claim 1, further comprising a front side guide and a back side guide, wherein each of the front side guide and the back side guide comprise a rail extending along a height of the server rack that interfaces with a respective one of the front-side deployable water barrier or the back-side deployable water barrier and maintain a position of the front-side deployable water barrier or the back-side deployable water barrier when in the deployed configuration.

5. An apparatus, comprising:
   a deployable water barrier attached to a top end of a server rack and having a stowed configuration and a deployed configuration, wherein the deployable water barrier in the deployed configuration extends exterior to a side of the server rack from the top end of the server rack along a height of the server rack to block water ingress into the server rack;
   a barrier deployment mechanism coupled to the deployable water barrier and operable to reconfigure the deployable water barrier from the stowed configuration to the deployed configuration via inflation of the deployable water barrier; and
   a controller operatively coupled with a sensor and the barrier deployment mechanism, wherein the controller is configured to cause the barrier deployment mechanism to inflate the deployable water barrier in response to a signal, generated by the sensor, indicative of water incident on the server rack.

6. The apparatus of claim 5, wherein the barrier deployment mechanism comprises a pressurized gas reservoir and a valve.

7. The apparatus of claim 6, wherein the pressurized gas reservoir comprises carbon dioxide gas.

8. The apparatus of claim 5, wherein the deployable water barrier comprises an airbag that deploys into the deployed configuration when the barrier deployment mechanism supplies gas to the deployable water barrier.

9. The apparatus of claim 5, wherein the controller is further configured to cause the barrier deployment mechanism to deploy the deployable water barrier in response to a signal from a building sprinkler system.

10. The apparatus of claim 5, further comprising a baffle positioned at the top end of the server rack configured to direct water towards the side of the server rack.

11. The apparatus of claim 5, wherein the barrier deployment mechanism comprises a gas pump configured to pump gas into the deployable water barrier.

12. The apparatus of claim 5, wherein the controller is further configured to interrupt power supplied to the server rack in response to the sensor detecting occurrence of water incident on the server rack.

13. The apparatus of claim 5, wherein the deployable water barrier conforms to a shape of the server rack when in the deployed configuration.

14. A method, comprising:
   receiving a signal indicative of incidence of water in a region surrounding a server rack housing electronic components; and
   in response to receiving the signal, reconfiguring a deployable water barrier via inflation of the deployable water barrier from a stowed configuration to a deployed configuration in which the deployable water barrier extends exterior to and along a height of the server rack to block water ingress into the server rack, wherein the deployable water barrier is attached to a top end of the server rack and extends from the top end of the server rack in the deployed configuration.

15. The method of claim 14, wherein reconfiguring the deployable water barrier comprises causing a gas supply assembly to supply gas to the deployable water barrier and cause the water barrier to deploy to the deployed configuration.

16. The method of claim 15, wherein causing the gas supply assembly to supply gas comprises causing a pressurized gas reservoir to supply gas to an airbag of the deployable water barrier.

17. The method of claim 15, wherein causing the gas supply assembly to supply gas comprises causing a gas pump to supply gas to an airbag of the deployable water barrier.

18. The method of claim 14, wherein reconfiguring the deployable water barrier is further in response to a signal received from a fire suppression system of a building housing the server rack.

19. The method of claim 14, further comprising interrupting a power supply of the server rack in response to receiving the signal.

\* \* \* \* \*